United States Patent
Kim et al.

(10) Patent No.: US 9,576,940 B2
(45) Date of Patent: Feb. 21, 2017

(54) LIGHT EMITTING DEVICE AND LCD BACKLIGHT USING THE SAME

(75) Inventors: Kyung Nam Kim, Seoul (KR); Sang Mi Park, Seoul (KR); Tomizo Matsuoka, Seoul (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 893 days.

(21) Appl. No.: 13/563,339

(22) Filed: Jul. 31, 2012

(65) Prior Publication Data

US 2013/0039032 A1    Feb. 14, 2013

Related U.S. Application Data

(63) Continuation of application No. 12/088,624, filed as application No. PCT/KR2006/003950 on Sep. 29, 2006, now Pat. No. 9,287,241.

(30) Foreign Application Priority Data

Sep. 30, 2005 (KR) ........................ 10-2005-0092001
Mar. 7, 2006 (KR) ........................ 10-2006-0021462

(51) Int. Cl.
*F21V 9/16* (2006.01)
*H01L 25/075* (2006.01)
(Continued)

(52) U.S. Cl.
CPC ..... *H01L 25/0753* (2013.01); *G02F 1/133603* (2013.01); *H01L 33/50* (2013.01); *H01L 2224/48091* (2013.01)

(58) Field of Classification Search
CPC .......... F21Y 2113/005; C09K 11/7741; C09K 11/7734; C09K 11/7728
(Continued)

(56) References Cited

U.S. PATENT DOCUMENTS 2,110,162 A    3/1938 Leverenz
2,402,760 A    6/1946 Leverenz
(Continued)

FOREIGN PATENT DOCUMENTS

CN    1584703    2/2005
CN    1675781    9/2005
(Continued)

OTHER PUBLICATIONS

The First Office Action dated Apr. 1, 2014 in Chinese Patent Application No. 201210147111.6.
(Continued)

*Primary Examiner* — Sean Gramling
(74) *Attorney, Agent, or Firm* — H.C. Park & Associates, PLC

(57) ABSTRACT

The present invention provides a light emitting device which comprises blue and red light emitting diode (LED) chips and at least one phosphor for emitting green light by means of light emitted from the blue LED chip, and an LCD backlight including the light emitting device. According to the light emitting device of the present invention, uniform white light can be implemented and both high luminance and wider color reproduction range can also be obtained. Accordingly, an LCD backlight for uniform light distribution on an LCD as well as low power consumption and high durability can be manufactured using the light emitting device.

20 Claims, 7 Drawing Sheets

(51) Int. Cl.
*G02F 1/1335* (2006.01)
*H01L 33/50* (2010.01)

(58) Field of Classification Search
USPC .................................. 362/84; 252/301.4 S
See application file for complete search history.

(56) References Cited

U.S. PATENT DOCUMENTS

| | | | |
|---|---|---|---|
| 3,623,996 A * | 11/1971 | Amster | C09K 11/0816 252/301.4 S |
| 3,639,254 A * | 2/1972 | Peters | C09K 11/0816 252/301.4 S |
| 4,065,688 A | 12/1977 | Thornton | |
| 4,303,913 A | 12/1981 | Tohda et al. | |
| 4,563,297 A | 1/1986 | Kukimoto et al. | |
| 5,208,462 A | 5/1993 | O'Connor | |
| 5,598,059 A | 1/1997 | Sun | |
| 5,656,888 A | 8/1997 | Sun et al. | |
| 5,834,053 A | 11/1998 | Dye et al. | |
| 6,180,073 B1 | 1/2001 | Huguenin et al. | |
| 6,252,254 B1 | 6/2001 | Soules et al. | |
| 6,417,019 B1 | 7/2002 | Mueller et al. | |
| 6,501,102 B2 | 12/2002 | Mueller-Mach et al. | |
| 6,521,915 B2 | 2/2003 | Odaki et al. | |
| 6,617,782 B2 | 9/2003 | Cheong et al. | |
| 6,680,569 B2 | 1/2004 | Mueller-Mach et al. | |
| 6,686,691 B1 | 2/2004 | Mueller et al. | |
| 6,695,982 B2 | 2/2004 | Ellens et al. | |
| 6,762,551 B2 | 7/2004 | Shiiki et al. | |
| 6,773,629 B2 | 8/2004 | Le Mercier et al. | |
| 6,783,700 B2 | 8/2004 | Tian et al. | |
| 6,809,347 B2 | 10/2004 | Tasch et al. | |
| 6,850,002 B2 * | 2/2005 | Rossner | C09K 11/773 252/301.6 S |
| 6,943,380 B2 | 9/2005 | Ota et al. | |
| 7,011,896 B2 | 3/2006 | Yano et al. | |
| 7,026,755 B2 | 4/2006 | Setlur et al. | |
| 7,229,573 B2 | 6/2007 | Setlur et al. | |
| 7,276,183 B2 | 10/2007 | Tian et al. | |
| 7,427,366 B2 | 9/2008 | Tian et al. | |
| 7,468,147 B2 | 12/2008 | Shida et al. | |
| 7,482,636 B2 | 1/2009 | Murayama et al. | |
| 7,608,200 B2 | 10/2009 | Seto et al. | |
| 7,842,961 B2 | 11/2010 | Kim et al. | |
| 7,959,321 B2 | 6/2011 | Ryu et al. | |
| 7,998,365 B2 | 8/2011 | Kim et al. | |
| 8,017,961 B2 | 9/2011 | Kim et al. | |
| 8,088,302 B2 | 1/2012 | Kim et al. | |
| 8,132,952 B2 | 3/2012 | Ryu et al. | |
| 2003/0020101 A1 | 1/2003 | Bogner et al. | |
| 2003/0076669 A1 | 4/2003 | Itoh et al. | |
| 2003/0228412 A1 | 12/2003 | Chen | |
| 2004/0012027 A1 | 1/2004 | Keller et al. | |
| 2004/0026683 A1 | 2/2004 | Yamada et al. | |
| 2004/0051111 A1 | 3/2004 | Ota et al. | |
| 2004/0104391 A1 * | 6/2004 | Maeda et al. | 257/79 |
| 2004/0124758 A1 | 7/2004 | Danielson et al. | |
| 2004/0135504 A1 * | 7/2004 | Tamaki et al. | 313/512 |
| 2004/0217364 A1 * | 11/2004 | Tarsa | H01L 25/0753 257/89 |
| 2004/0233664 A1 | 11/2004 | Beeson et al. | |
| 2005/0046334 A1 | 3/2005 | Fujiwara | |
| 2005/0073495 A1 * | 4/2005 | Harbers | G02F 1/133603 345/102 |
| 2005/0082574 A1 | 4/2005 | Tasch et al. | |
| 2005/0123243 A1 | 6/2005 | Steckl et al. | |
| 2005/0135118 A1 | 6/2005 | Takata | |
| 2005/0140272 A1 * | 6/2005 | Shirata | 313/503 |
| 2005/0162069 A1 | 7/2005 | Ota et al. | |
| 2005/0211992 A1 | 9/2005 | Nomura et al. | |
| 2005/0224828 A1 | 10/2005 | Oon et al. | |
| 2005/0236958 A1 | 10/2005 | Wang et al. | |
| 2005/0254258 A1 | 11/2005 | Lee | |
| 2005/0276074 A1 | 12/2005 | Ryu | |
| 2006/0027788 A1 | 2/2006 | Stiles et al. | |
| 2006/0081862 A1 | 4/2006 | Chua et al. | |
| 2006/0082296 A1 | 4/2006 | Chua et al. | |
| 2006/0158090 A1 * | 7/2006 | Wang | C09K 11/7734 313/485 |
| 2006/0203468 A1 | 9/2006 | Beeson et al. | |
| 2006/0215387 A1 * | 9/2006 | Wang | G02B 6/0018 362/23.18 |
| 2007/0075306 A1 | 4/2007 | Hayashi et al. | |
| 2007/0090381 A1 | 4/2007 | Otsuka et al. | |
| 2007/0221938 A1 | 9/2007 | Radkov et al. | |
| 2007/0259206 A1 | 11/2007 | Oshio | |
| 2008/0084150 A1 | 4/2008 | Cok | |
| 2008/0212305 A1 | 9/2008 | Kawana et al. | |
| 2009/0066230 A1 | 3/2009 | Hirosaki et al. | |
| 2009/0218581 A1 | 9/2009 | Schmidt et al. | |
| 2009/0295272 A1 | 12/2009 | Oshio | |

FOREIGN PATENT DOCUMENTS

| | | |
|---|---|---|
| DE | 10028266 | 12/2001 |
| JP | 53-061964 | 6/1978 |
| JP | 57-128772 | 8/1982 |
| JP | 2927279 | 5/1999 |
| JP | 2000-171796 | 6/2000 |
| JP | 2000-275636 | 10/2000 |
| JP | 2001-144331 | 5/2001 |
| JP | 2002-088359 | 3/2002 |
| JP | 2002-156531 | 5/2002 |
| JP | 2003-179269 | 6/2003 |
| JP | 2003-203504 | 7/2003 |
| JP | 2003-315796 | 11/2003 |
| JP | 2004-505172 | 2/2004 |
| JP | 2004-094031 | 3/2004 |
| JP | 2004-119375 | 4/2004 |
| JP | 2004-119743 | 4/2004 |
| JP | 2004-161807 | 6/2004 |
| JP | 2004-527638 | 9/2004 |
| JP | 2004-296830 | 10/2004 |
| JP | 2004-327492 | 11/2004 |
| JP | 2005-019997 | 1/2005 |
| JP | 2005-079500 | 3/2005 |
| JP | 2005-189750 | 7/2005 |
| JP | 2005-530349 | 10/2005 |
| JP | 2005-350649 | 12/2005 |
| JP | 2005-354027 | 12/2005 |
| JP | 2006-509871 | 3/2006 |
| JP | 2009-507935 | 2/2009 |
| KR | 10-2001-0089508 | 10/2001 |
| KR | 10-2001-0097147 | 11/2001 |
| KR | 10-2001-0101761 | 11/2001 |
| KR | 10-2002-0027538 | 4/2002 |
| KR | 10-2002-0041480 | 6/2002 |
| KR | 10-2002-0067818 | 8/2002 |
| KR | 10-2004-0000004 | 1/2004 |
| KR | 10-2004-0086604 | 10/2004 |
| KR | 10-2004-0087974 | 10/2004 |
| KR | 10-2004-0088418 | 10/2004 |
| KR | 10-2005-0117165 | 12/2005 |
| KR | 10-2006-0028844 | 4/2006 |
| KR | 10-2006-0028932 | 4/2006 |
| KR | 10-2006-0063586 | 6/2006 |
| KR | 10-0601200 | 7/2006 |
| KR | 10-2007-0002385 | 1/2007 |
| KR | 10-0700231 | 3/2007 |
| TW | 563261 | 11/2003 |
| WO | 98/05078 | 2/1998 |
| WO | 01/24229 | 4/2001 |
| WO | 02-11173 | 2/2002 |
| WO | 02-097901 | 12/2002 |
| WO | 02/098180 | 12/2002 |
| WO | 03/021691 | 3/2003 |
| WO | 03/080763 | 10/2003 |
| WO | 03/081957 | 10/2003 |
| WO | 2003/107441 | 12/2003 |
| WO | 2004-007636 | 1/2004 |
| WO | 2004-055910 | 7/2004 |

(56) References Cited

FOREIGN PATENT DOCUMENTS

| WO | 2005/026285 | 3/2005 |
|----|-------------|--------|
| WO | 2005/068584 | 7/2005 |
| WO | 2006-126817 | 11/2006 |

OTHER PUBLICATIONS

Notice of Allowance dated Aug. 3, 2012 issued for U.S. Appl. No. 12/293,160.
TW Preliminary Notice of First Office Action of Taiwan Application No. 09820622730 Dated Oct. 2, 2009, corresponding to U.S. Appl. No. 11/912,383.
Communication with Supplementary European Search Report of EP 06 76 8575 dated Aug. 4, 2010, corresponding to U.S. Appl. No. 11/912,383.
International Search Report of PCT/KR2006/001921 dated Aug. 31, 2006, corresponding to U.S. Appl. No. 11/912,383.
Non-Final Office Action of U.S. Appl. No. 11/912,383 issued on Jun. 29, 2010, corresponding to U.S. Appl. No. 11/912,383.
Non-Final Office Action of U.S. Appl. No. 11/912,383 issued on Nov. 10, 2010, corresponding to U.S. Appl. No. 11/912,383.
Notice of Allowance of U.S. Appl. No. 11/912,383 issued on Feb. 23, 2011, corresponding to U.S. Appl. No. 11/912,383.
Non-Final Office Action of U.S. Appl. No. 11/912,383 issued on Mar. 29, 2011.
Philippot et al, "Relation between properties and structural Evolution of Some si, Ge, Sn Ternary Chalogenides", React.Solids 8th Meeting, 1976, pp. 535-539.
European Search Report of EP Application No. 11 15 1900.5 issued on Apr. 26, 2011.
Notice of Allowance of U.S. Appl. No. 11/912,283 dated on Mar. 11, 2011.
Extended European Search Report of EU 06 71 6411 dated Feb. 16, 2009 corresponding to U.S. Appl. No. 12/293,160.
International Search Report of PCT/KR2006/000961 dated Dec. 11, 2006 corresponding to U.S. Appl. No. 12/293,160.
Non-Final Office Action of U.S. Appl. No. 12/293,160 issued on May 23, 2011.
Final Office Action of U.S. Appl. No. 12/293,160 dated on Nov. 23, 2011.
Preliminary Notice of First Office Action of Taiwanese Patent Application No. 095109597 dated Apr. 17, 2012.
Non-Final Office Action of U.S. Appl. No. 12/293,160 dated on Mar. 2, 2012.
Chinese Office Action of Chinese Application No. 200680010332.1 dated Aug. 29, 2008, corresponding to U.S. Appl. No. 11/909,700.
International Search Report of PCT/KR2006/000885 dated on Jun. 21, 2006, corresponding to U.S. Appl. No. 11/909,700.
Written Opinion of PCT/KR2006/000885 dated on Jun. 21, 2006, corresponding to U.S. Appl. No. 11/909,700.
Non-Final Office Action of U.S. Appl. No. 11/909,700 issued on Jun. 3, 2010, corresponding to U.S. Appl. No. 11/909,700.
Notice of Allowance of U.S. Appl. No. 11/909,700 issued on Nov. 30, 2010, corresponding to U.S. Appl. No. 11/909,700.
Chinese Office Action dated Feb. 5, 2010 in Chinese Patent App. No. 200680018490.1, corresponding to U.S. Appl. No. 11/912,384.
International Search Report of PCT/KR2006/001923 dated on Aug. 31, 2006, corresponding to U.S. Appl. No. 11/912,384.
Non-Final Office Action of U.S. Appl. No. 11/912,384 issued on Sep. 9, 2010, corresponding to U.S. Appl. No. 11/912,384.
Final Office Action of U.S. Appl. No. 11/948,813 issued on Dec. 8, 2010.
Non-Final Office Action of U.S. Appl. No. 11/948,813 issued on Aug. 18, 2010.
Non-Final Office Action of U.S. Appl. No. 12/306,664 issued on Feb. 1, 2011.
European Search Report of EP06768577.6 issued on Jan. 20, 2011, corresponding to U.S. Appl. No. 11/912,384.
Notice of Allowance of U.S. Appl. No. 11/912,384 issued on Feb. 2, 2011, corresponding to U.S. Appl. No. 11/912,384.
Baur et al. "White Light Emitting Diodes", (1998), Adv. Solid State Phys., vol. 67, pp. 67-78, corresponding to U.S. Appl. No. 11/913,538.
International Search Report of PCT/KR2006/002330 dated on Oct. 9, 2006, corresponding to U.S. Appl. No. 11/913,538.
Non-Final Office Action of U.S. Appl. No. 11/913,538 issued on Nov. 25, 2008, corresponding to U.S. Appl. No. 11/913,538.
Final Office Action of U.S. Appl. No. 11/913,538 issued on Apr. 17, 2009, corresponding to U.S. Appl. No. 11/913,538.
Non-Final Office Action of U.S. Appl. No. 11/913,538 issued on Jul. 31, 2009, corresponding to U.S. Appl. No. 11/913,538.
Final Office Action of U.S. Appl. No. 11/913,538 issued on Mar. 25, 2010, corresponding to U.S. Appl. No. 11/913,538.
Notice of Allowance of U.S. Appl. No. 11/913,538 issued on Jul. 23, 2010, corresponding to U.S. Appl. No. 11/913,538.
Non-Final Office Action of U.S. Appl. No. 12/904,219 issued on Mar. 3, 2011.
Final Office Action of U.S. Appl. No. 12/904,219 issued on Sep. 2, 2011.
Notice of Allowance of U.S. Appl. No. 12/293,160 dated on May 25, 2012.
International Search Report of PCT/KR2006/003950 dated Dec. 28, 2006.
Non-Final Office Action of U.S. Appl. No. 12/088,624 dated Oct. 6, 2010.
Non-Final Office Action of U.S. Appl. No. 12/088,624 dated Apr. 7 2011.
Non-Final Office Action of U.S. Appl. No. 12/088,624 dated Oct. 13, 2011.
Non-Final Office Action of U.S. Appl. No. 12/088,624 dated Mar. 14, 2012.

* cited by examiner

LIGHT EMITTING DEVICE AND LCD BACKLIGHT USING THE SAME

CROSS-REFERENCE TO RELATED APPLICATIONS

This application is a Continuation of U.S. patent application Ser. No. 12/088,624, filed on Mar. 28, 2008, which is the National Stage Entry of International Application No. PCT/KR2006/003950, filed Sep. 29, 2006 and claims priority from Korean Patent Application No. 10-2006-0021462, filed Mar. 7, 2006, and Korean Patent Application No. 10-2005-0092001, filed Sep. 30, 2005, which are hereby incorporated by reference for all purposes as if fully set forth herein.

BACKGROUND

Field

The present invention relates a light emitting device and an LCD backlight using the light emitting device. More particularly, the present invention relates to a light emitting device capable of implementing uniform white light and having a wide color reproduction range, and an LCD backlight using the light emitting device.

Discussion of the Background

As high-performance portable information processing devices and mobile communication terminals have been continuously required with the development of information and communication technologies, various kinds of components with high performance and quality have been continuously required in systems. Liquid crystal displays (LCDs), which have been generally applied to monitors of medium- and large-sized terminals such as notebook computers, require white backlight sources at rear side thereof. In a case where a cold cathode fluorescent lamp (CCFL) is generally used as such a backlight source, there are many advantages in that uniform white light with high luminance is implemented, and the like. However, it may be difficult to continuously use the CCFL, because the CCFL cannot be further employed due to the future restriction on the use of mercury. Accordingly, studies on backlight sources with which the CCFLs can be replaced have been actively conducted. Among the backlight sources, a backlight source using a light emitting device has come into the spotlight as a light source capable of substituting for the CCFLs.

A light emitting diode (LED) refers to a device in which minority carriers (electrons or holes) injected by means of a p-n junction structure of a semiconductor are produced, and light is emitted due to recombination of the carriers. Since the LED has low power consumption and long lifespan, can be mounted in a narrow space and has strong resistance against vibration, it has been increasingly employed as components in a variety of information processing and communication devices.

As a prior art of an LCD backlight source using a light emitting diode, an LCD backlight source module has been disclosed in Korean Patent Laid-Open Publication No. 2002-0041480, in which blue light emitted from a blue light emitting diode is converted into white light using a phosphor and the white light is then incident onto a light guide plate for the uniform light distribution, so that an LCD can have uniform light distribution, low power consumption and high durability. In the LCD backlight source module, the blue light emitting diode and phosphor can be used to implement uniform white light with high luminance. However, since a color reproduction range which can be expressed when light is transmitted into RGB color filters is considerably narrow in a case where the LCD backlight source module is used as a white light source positioned at the rear of an LCD, there is a limitation in the implementation of images closer to natural colors. Particularly, since the above color reproduction range is greatly lower than the color reproduction range provided by the National Television System Committee (NTSC), it is difficult to reproduce more realistic colors.

As another prior art, a method of driving an LCD backlight has been disclosed in Korean Patent Laid-Open Publication No. 2004-0087974, in which a single white light emitting diode or three red, blue and green light emitting diodes are used in an LCD backlight to form a white backlight source, and a microcomputer is used to measure input current and color of each LED and then to adjust the current supplied finally to each LED. A backlight source using three red, blue and green light emitting diodes can satisfy a considerably wide color reproduction range as compared with an existing CCFL, but since thermal or temporal characteristics of the respective LEDs are different from one another, there are disadvantages in that a color tone is changed depending on a use environment, and particularly, the colors are not uniformly mixed due to the occurrence of uneven colors, or the like. Further, there are additional disadvantages in that color coordinates vary due to change in the output of each chip depending on an ambient temperature, it is difficult to implement high luminance and a circuit configuration in which the driving of each LED chip is considered is complicated.

SUMMARY

The present invention is conceived to solve the aforementioned problems. Accordingly, an object of the present invention is to provide a light emitting device capable of implementing uniform white light and having high luminance and a wide color reproduction range.

Another object of the present invention is to provide an LCD backlight with uniform light distribution on an LCD as well as low power consumption and high durability using a light emitting device capable of implementing uniform white light and having a wide color reproduction range.

According to an aspect of the present invention for achieving the aforementioned objects, there is provided a light emitting device, which comprises at least one blue light emitting diode (LED) chip, at least one red LED chip, and at least one phosphor for emitting green light by means of light emitted from the blue LED chip.

Preferably, the blue LED chip emits light with a wavelength of 430 to 500 nm, the red LED chip emits light with a wavelength of 580 to 760 nm, and the phosphor emits light with a wavelength of 500 to 580 nm. More preferably, the blue LED chip emits light with a wavelength of 450 to 470 nm, the red LED chip emits light with a wavelength of 620 to 640 nm, and the phosphor emits light with a wavelength of 515 to 540 nm.

A silicate- or thiogallate-based phosphor may be used as the phosphor. Moreover, two or more kinds of different phosphors for emitting green light may be combined and employed.

The phosphor may include a phosphor expressed as in the following chemical formula:

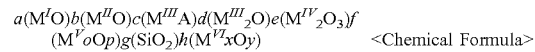

$$a(M^{I}O)b(M^{II}O)c(M^{III}A)d(M^{III}_{2}O)e(M^{IV}_{2}O_{3})f(M^{V}oOp)g(SiO_{2})h(M^{VI}xOy)$$ <Chemical Formula> wherein $M^{I}$ is at least one element selected from the group consisting of Pb and Cu, $M^{II}$ is at least one element selected from the group consisting of Be, Mg, Ca, Sr, Ba, Zn, Cd and Mn, $M^{III}$ is at least one element selected from the group consisting of Li, Na, K, Rb, Cs, Au and Ag, $M^{IV}$ is at least one element selected from the group consisting of B, Al, Ga and In, $M^{V}$ is at least one element selected from the group consisting of Ge, V, Nb, Ta, W, Mo, Ti, Zr and Hf, $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu, A is at least one element selected from the group consisting of F, Cl, Br and I, and wherein a, b, c, d, e, f, g, h, o, p, x and y are set in a range of $0<a\leq0.2$, $0<b\leq8$, $0\leq c\leq0.4$, $0\leq d\leq2$, $0\leq e\leq2$, $0\leq f\leq0.2$, $0<g\leq10$, $0<h\leq0.5$, $1\leq o\leq0.2$, $1\leq p\leq0.5$, $1\leq x\leq2$ and $1\leq y\leq5$.

The phosphor may include a phosphor expressed as in the following chemical formula:

<Chemical Formula> wherein A is at least one element selected from the group consisting of Ba, Sr and Ca, B is at least one element selected from the group consisting of Al, Ga and In, $M^{I}$ is at least one rare earth element selected from the group consisting of Sc, Y, La, Gd and Lu, $M^{II}$ is at least one element selected from the group consisting of Mg, Zn and Be, and wherein x and y are set in a range of $0.005<x<0.9$, $0<y<0.995$ and $x+y<1$.

The phosphor may include a phosphor expressed as in the following chemical formula:

<Chemical Formula> wherein A is at least one element selected from the group consisting of Ba, Sr and Ca, B is at least one element selected from the group consisting of Al, Ga and In, $M^{I}$ is at least one rare earth element selected from the group consisting of Sc, Y, La, Gd and Lu, $M^{II}$ is at least one element selected from the group consisting of Li, Na and K, and wherein x and y are set in a range of $0.005<x<0.9$, $0<y<0.995$ and $x+y<1$.

The phosphor may further include a phosphor expressed in at least one of the following chemical formulas:

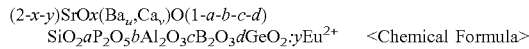

<Chemical Formula> wherein x, y, a, b, c, d, u and v are set in a range of $0\leq x<1.6$, $0.005<y<0.5$, $x+y\leq1.6$, $0\leq a<0.5$, $0\leq b<0.5$, $0\leq c<0.5$, $0\leq d<0.5$ and $u+v=1$; and

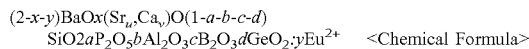

<Chemical Formula> wherein x, y, u and v are set in a range of $0.01<x<1.6$, $0.005<y<0.5$, $u+v=1$ and $xu\geq0.4$, and at least one value of a, b, c and d is greater than 0.01.

The light emitting device of the present invention may further comprise a scattering agent with a size of 0.1 to 20 μm. The scattering agent may include at least one selected from the group consisting of $SiO_2$, $Al_2O_3$, $TiO_2$, $Y_2O_3$, $CaCO_3$ and MgO.

The light emitting device of the present invention may further comprise a body with the LED chips mounted thereon, and a molding member which is formed on top of the body to encapsulate the LED chips and contains the phosphor. The body may be a substrate or a heat sink or a lead terminal.

According to another aspect of the present invention, there is provided an LCD backlight comprising the aforementioned light emitting device.

According to the present invention, a white light emitting device capable of implementing uniform white light and having high luminance and a wide color reproduction range can be manufactured by using blue and red light emitting diode chips and a phosphor that emits green light by means of blue light. In particular, there is an advantage in that a light emitting device of the present invention can be applied to an LCD backlight due to the implementation of uniform light and a superior white light emitting characteristic with a wide color reproduction range.

DETAILED DESCRIPTION OF THE ILLUSTRATED EMBODIMENTS

Figure 1:
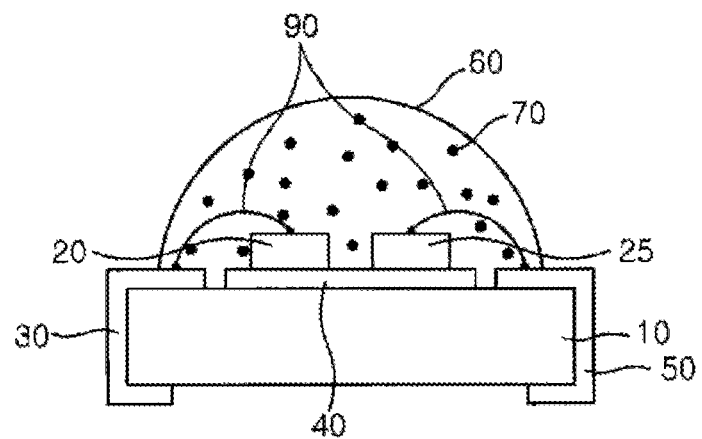
FIG. 1 is a sectional view showing a first embodiment of a light emitting device according to the present invention.

Hereinafter, preferred embodiments of the present invention will be described in detail with reference to the accompanying drawings. However, the present invention is not limited to the embodiments set forth herein but can be implemented in different forms. Rather, the preferred embodiments are merely provided to allow the present invention to be completely described herein and to fully convey the scope of the invention to those skilled in the art. In the drawings, like elements are designated by the same reference numerals.

A light emitting device according to the present invention comprises blue and red light emitting diode (LED) chips and at least one or more phosphors each emitting green light using a portion of blue light as an excitation source such that white light can be obtained from the combination of blue and red light emission from the LED chips and green light emission from the phosphors. That is, white light can be implemented through the combination of a blue LED chip that emits light with a wavelength of 430 to 500 nm, a red LED chip that emits light with a wavelength of 580 to 760 nm, and a phosphor that can produce green light with a wavelength of 500 to 580 nm using blue light as an excitation source. More preferably, the light emitting device according to the present invention comprises the combination of a blue LED chip that emits light with a wavelength of 450 to 470 nm, a red LED chip that emits light with a wavelength of 620 to 640 nm, and a phosphor that can produce green light with a wavelength of 515 to 540 nm using the blue light as an excitation source. A silicate- or thiogallate-based phosphor may be used as the phosphor that is excited by blue light and emits green light. Moreover, two or more kinds of different phosphors may be employed in a state where they are mixed with one another.

The silicate-based phosphor has a structure as expressed in the following chemical formula of chemistry FIG. 1:

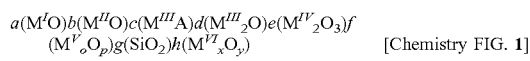  [Chemistry FIG. 1]

In the chemistry FIG. 1, $M^I$ is at least one element selected from the group consisting of Pb and Cu; $M^{II}$ is at least one element selected from the group consisting of Be, Mg, Ca, Sr, Ba, Zn, Cd and Mn; $M^{III}$ is at least one element selected from the group consisting of to Li, Na, K, Rb, Cs, Au and Ag; $M^{IV}$ is at least one element selected from the group consisting of B, Al, Ga and In; $M^V$ is at least one element selected from the group consisting of Ge, V, Nb, Ta, W, Mo, Ti, Zr and Hf; $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A is at least one element selected from the group consisting of F, Cl, Br and I.

Further, in the chemistry FIG. 1, a, b, c, d, e, f, g, h, o, p, x and y are set in a range of $0<a\leq0.2$, $0<b\leq8$, $0\leq c\leq4$, $0\leq d\leq2$, $0\leq e\leq2$, $0\leq f\leq2$, $0<g\leq10$, $0<h\leq5$, $1\leq o\leq2$, $1\leq p\leq5$, $1\leq x\leq0.2$ and $1\leq y\leq5$.

Tables 1 and 2 illustrate an effect when the silicate-based phosphor having a structure as chemistry FIG. 1 contains copper.

Table 1 shows the changes in zeta potential and mobility between a phosphor containing no copper and other phosphors containing copper with different concentrations, and Table 2 shows relative intensities with respect to time of compounds containing copper and a compound containing no copper under a temperature of 85° C. and a relative humidity of 100%.

TABLE 1

| Phosphor Composition | Zeta Potential | Mobility |
| --- | --- | --- |
| (Ca,Sr,Ba,Eu)—SiO$_4$ containing no copper | −3.5 mV | −2.4 · 10$^{-5}$ cm$^2$/Vs |
| (Ca,Sr,Ba,Eu)—SiO$_4$ containing 0.005 mol of copper | −3.3 mV | −2.3 · 10$^{-5}$ cm$^2$/Vs |
| (Ca,Sr,Ba,Eu)—SiO$_4$ containing 0.01 mol of copper | −2.5 mV | −1.8 · 10$^{-5}$ cm$^2$/Vs |
| (Ca,Sr,Ba,Eu)—SiO$_4$ containing 0.1 mol of copper | +0.33 mV | −1.4 · 10$^{-5}$ cm$^2$/Vs |

TABLE 2

| Phosphor composition | Relative Intensity after 24 hours | Relative Intensity after 100 hours | Relative Intensity after 200 hours | Relative Intensity after 500 hours | Relative Intensity after 1000 hours |
| --- | --- | --- | --- | --- | --- |
| (Ca,Sr,Ba,Eu)—SiO$_4$ containing no copper | 98.3 | 96.0 | 93.3 | 84.7 | 79.3 |
| (Ca,Sr,Ba,Eu)—SiO$_4$ containing 0.005 mol of copper | 100.0 | 99.6 | 98.6 | 96.3 | 94.0 |
| (Ca,Sr,Ba,Eu)—SiO$_4$ containing 0.01 mol of copper | 98.6 | 98.5 | 95.8 | 92.8 | 90.1 |
| (Ca,Sr,Ba,Eu)—SiO$_4$ containing 0.1 mol of copper | 98.7 | 98.0 | 96.4 | 93.2 | 90.0 |

Referring to Tables 1 and 2, the stability against water of the compound containing copper is much higher than that of the compound containing no copper. Thus, the silicate-based phosphor containing copper has an improved stability against water, moisture and a polar solvent. In a case where the silicate-based phosphor is applied to light emitting devices or LCD backlights under the above environment, it can provide superior reliability.

Figure 2:
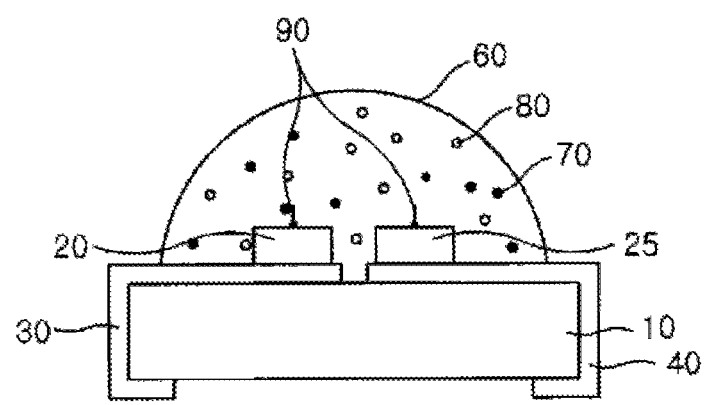
FIG. 2 is a sectional view showing a second embodiment of the light emitting device according to the present invention.

The thiogallate-based phosphor has a structure as expressed in the following chemical formula of chemistry FIG. 2:

  [Chemistry FIG. 2]

In the chemistry FIG. 2, A is at least one element selected from the group consisting of Ba, Sr and Ca; B is at least one element selected from the group consisting of Al, Ga and In; $M^I$ is at least one rare earth element selected from the group consisting of Sc, Y, La, Gd and Lu; $M^{II}$ is at least one element selected from the group consisting of Mg, Zn and Be. Further, in the chemistry FIG. 2, x and y are set in a range of $0.005<x<0.9$, $0<y<0.995$ and $x+y<1$. Since the same amounts of $M^I$ and $M^{II}$ are substituted at positions A and B, respectively, a charge balance is accomplished. Particularly, $M^I$ and $M^{II}$ can be selected to have ion radiuses similar to those of elements at A and B positions, respectively. Accordingly, since the crystal field amplitude of active ions is not changed, the light emitting efficiency can be increased while maintaining the emission wavelength of a phosphor with a composition before substitution.

Figure 3:
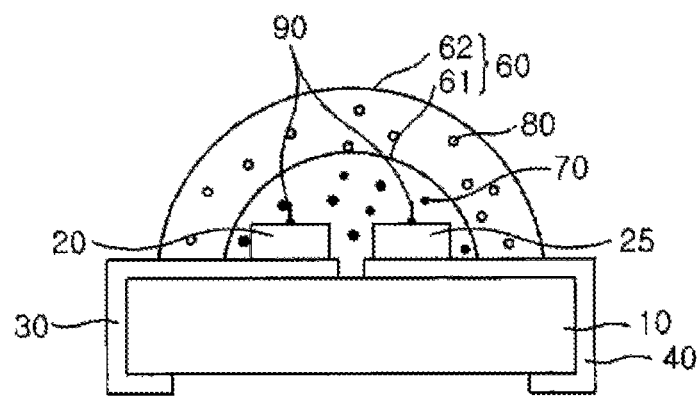
FIG. 3 is a sectional view showing a third embodiment of the light emitting device according to the present invention.

Further, the chemical formula of the thiogallate-based phosphor has a structure as the following chemical formula of chemistry FIG. 3:

  [Chemistry FIG. 3]

In the chemistry FIG. 3, A is at least one element selected from the group consisting of Ba, Sr and Ca; B is at least one element selected from the group consisting of Al, Ga and In; $M^I$ is at least one rare earth element selected from the group consisting of Sc, Y, La, Gd and Lu; $M^{II}$ is at least one element selected from the group consisting of Li, Na and K. Further, x and y are set in a range of $0.005<x<0.9$, $0<y<0.995$ and $x+y\leq1$.

In the thiogallate-based phosphor having a structure as expressed in the chemistry FIG. 3, a position A required for a divalent ion is first replaced with a trivalent ion having a similar ion size and then similarly replaced with a monovalent ion having a similar ion size at the same amount of the trivalent ion in order to compensate for the charge unbalance due to the replacement with the trivalent ion. Thus, a superior emission characteristic can be obtained while the entire charge balance is kept at the position A required for a divalent ion.

That is, in the thiogallate-based phosphor having a structure as expressed in the chemistry FIG. 3, i.e. in the general formula of the thiogallate phosphor $AB_2S_4$, a position A required for a divalent ion is first replaced with a trivalent $M^{II}$ having a similar ion size and then similarly replaced with a monovalent $M^I$ having a similar ion size at the same amount of the trivalent $M^{II}$ in order to compensate for the charge unbalance due to the replacement with the trivalent ion. Thus, a superior emission characteristic can be obtained while the entire charge balance is kept at the position A required for a divalent ion.

Consequently, since the replacement of ions having the same size is considered in such a double replacement, the thiogallate-based phosphor having a structure as expressed in the chemistry FIG. 3 can maintain the same charge balance as the existing thiogallate phosphor while not causing the crystal lattice distortion. Accordingly, the thiogallate-based phosphor has superior emission efficiency and luminous intensity while maintaining the entire charge balance.

Moreover, a YAG-based phosphor is further included with the silicate- or thiogallate-based phosphor such that much superior green light can be implemented under the excitation in a blue wavelength band.

Figure 4:
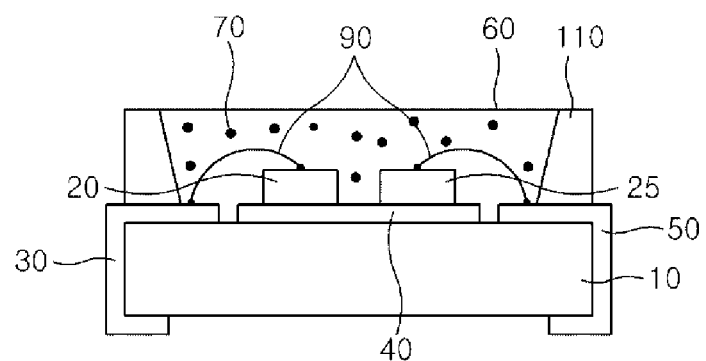
FIG. 4 is a sectional view showing a fourth embodiment of the light emitting device according to the present invention.

The above YAG-based phosphor has a structure as expressed in the following chemical formula of chemistry FIG. 4:

$$(Re_{1-r}Sm_r)_3(Al_{1-s}Ga_s)_5O_{12}:Ce \qquad \text{[Chemistry FIG. 4]}$$

In the chemistry FIG. 4, Re is at least one element selected from the group consisting of Y and Gd. Further, in the chemistry FIG. 4, r and s are set in a range of $0 \le r < 1$ and $0 \le s \le 1$.

Figure 5:
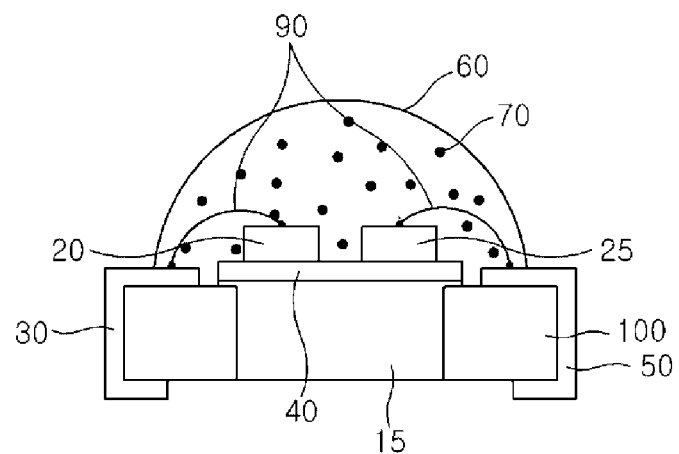
FIG. 5 is a sectional view showing a fifth embodiment of the light emitting device according to the present invention.

In addition, the phosphor has a structure as expressed in the following chemical formula of chemistry FIG. 5:

$$M^I_a M^{II}_b M^{III}_c O_d \qquad \text{[Chemistry FIG. 5]}$$

In the chemistry FIG. 5, $M^I$ is at least Ce and at least one element selected from the group consisting of Cr, Mn, Fe, Co, Ni, Cu, Pr, Nd, Sm, Eu, Tb, Dy, Ho, Er, Tm and Tb; $M^{II}$ is at least one element selected from the group consisting of Mg, Ca, Zn, Sr, Cd and Ba; and $M^{III}$ is at least one element selected from the group consisting of Al, Sc, Ga, Y, In, La, Gd and Lu. Further, in the chemistry FIG. 5, a, b, c and d are set in a range of $0.0001 \le a \le 0.2$, $0.8 \le b \le 1.2$, $1.6 \le c \le 2.4$ and $3.2 \le d \le 4.8$.

Figure 6:
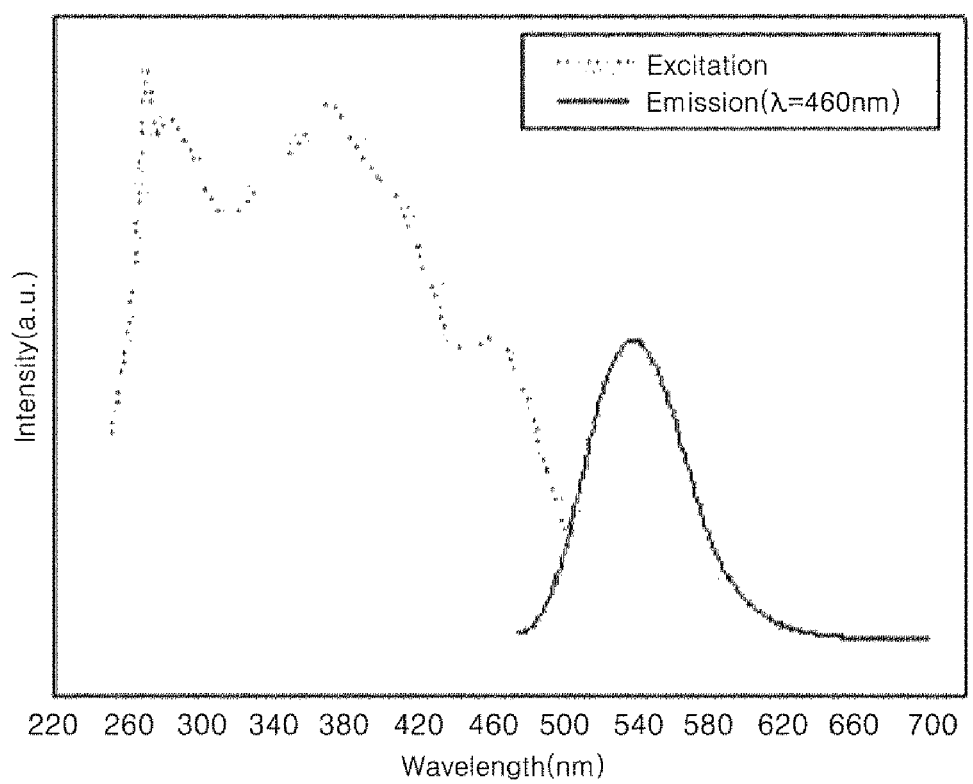
FIG. 6 is a graph illustrating the excitation and emission spectra of a silicate phosphor applied to the present invention.

In addition, the phosphor has a structure as expressed in the following chemical formula of chemistry FIG. 6:

$$(Sr_{1-u-v-x}Mg_uCa_vBa_x)(Ga_{2-y-z}Al_yIn_zS_4):Eu^{2+} \qquad \text{[Chemistry FIG. 6]}$$

In the chemistry FIG. 6, u, v, x, y and z are set in a range of $0 \le u \le 1$, $0 \le v \le 1$, $0 \le x \le 1$, $0 \le (u+v+x) \le 1$, $0 \le y \le 2$, $0 \le z \le 2$ and $0 \le y+z \le 2$.

Figure 7:
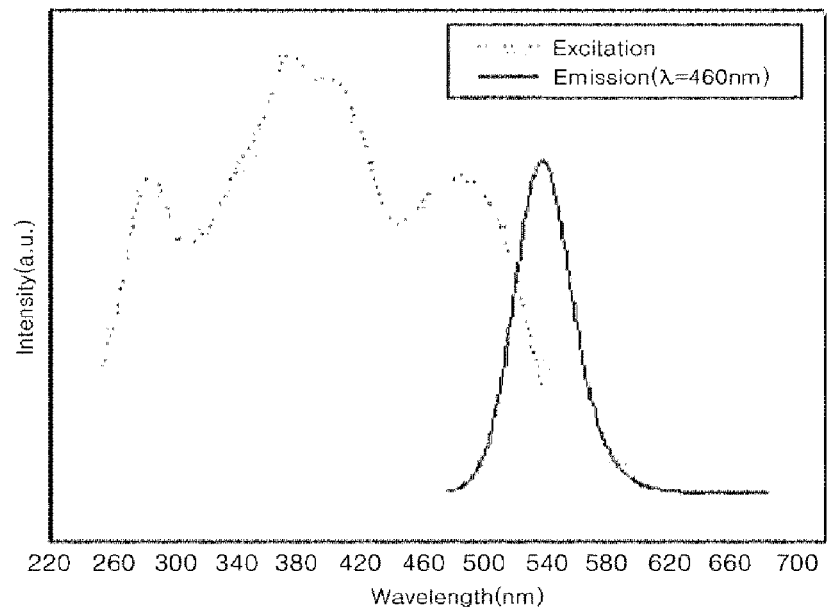
FIG. 7 is a graph illustrating the excitation and emission spectra of a thiogallate phosphor applied to the present invention.

Furthermore, the phosphor has a structure as expressed in the following chemical formula of chemistry FIG. 7:

$$(2-x-y)SrOx(Ba_uCa_v)O(1-a-b-c-d)$$
$$SiO_2 aP_2O_5 bAl_2O_3 cB_2O_3 dGeO_2:yEu^{2+} \qquad \text{[Chemistry FIG. 7]}$$

In the chemistry FIG. 7, x, y, a, b, c, d, u and v are set in a range of $0 \le x < 1.6$, $0.005 < y < 0.5$, $x+y \le 1.6$, $0 \le a < 0.5$, $0 \le b < 0.5$, $0 \le c < 0.5$, $0 \le d < 0.5$ and $u+v=1$.

Figure 8:
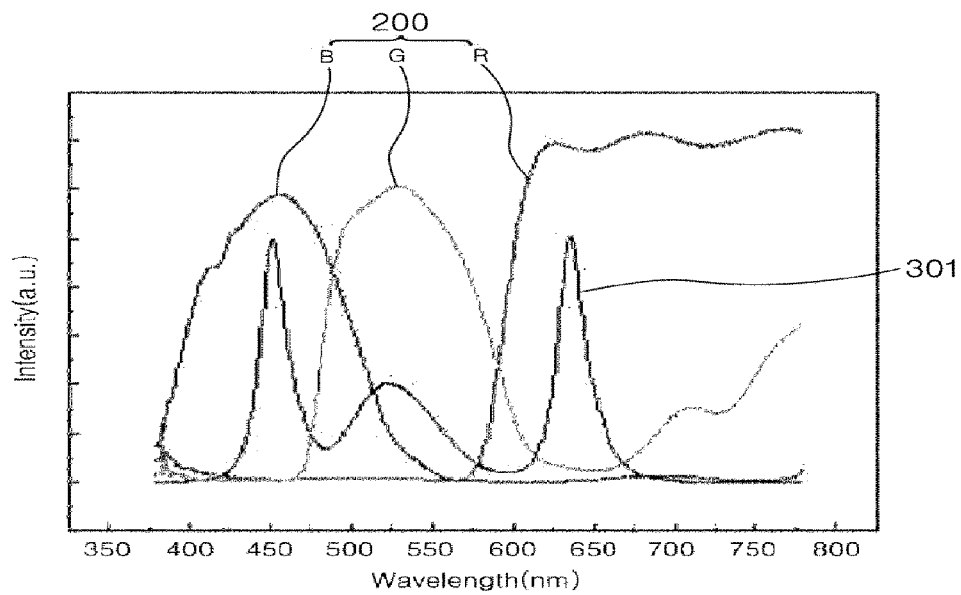
FIG. 8 is a graph illustrating emission spectra of a light emitting device comprising blue and red light emitting diode chips and a silicate phosphor together with the transmittance of a general RGB color filter.

In addition, the phosphor has a structure as expressed in the following chemical formula of chemistry FIG. 8:

$$(2-x-y)BaOx(Sr_uCa_v)O(1-a-b-c-d)$$
$$SiO_2 aP_2O_5 bAl_2O_3 cB_2O_3 dGeO_2:yEu^{2+} \qquad \text{[Chemistry FIG. 8]}$$

In the chemistry FIG. 8, x, y, u and v are set in a range of $0.01 < x < 1.6$, $0.005 < y < 0.5$, $u+v=1$ and $xu \ge 0.4$; and at least one value of a, b, c and d is greater than 0.01.

Accordingly, the light emitting device of the present invention has the blue and red LED chips and the aforementioned phosphor, and thus, white light can be implemented through the combination of the lights emitted from the chips and the phosphor. That is, blue and red light emitted from the LED chips and green light wavelength-converted by the phosphor are mixed to implement the white light. Since a spectrum area in a green region with higher visibility is considerably increased as compared with in a case where a conventional three-color LED of red, blue and green is used, the white light emitting device of the present invention can obtain high luminescence. Further, there is an advantage in that the white light emitting device of the present invention can have a wider color reproduction range as compared with in a case where a conventional blue LED and a phosphor are used. Therefore, a light emitting device of the present invention can be employed to an LCD backlight as a superior light source due to its enhanced characteristics of high luminance and wide color reproduction range. In particular, a thiogallate-based phosphor has a relatively narrow bandwidth, i.e. a bandwidth of an emission spectrum measured at a ½ peak intensity. Accordingly, a light emitting device employing a thiogallate-based phosphor with a narrow bandwidth can be used as a light source of an LCD backlight to enhance the color reproduction of LCDs.

Hereinafter, a light emitting device of the present invention will be described with reference to the accompanying drawings.

FIG. 1 is a sectional view showing a first embodiment of a light emitting device according to the present invention.

Referring to this figure, the light emitting device comprises a substrate 10; electrodes 30, 40 and 50 formed on the substrate 10; and LED chips 20 and 25 that emit blue and red light, respectively. A molding member 60 for encapsulating the LED chips 20 and 25 is further formed on top of the substrate, and the aforementioned phosphor 70 is contained in the interior of the molding member 60.

The substrate 10 may include a reflective portion (not shown) manufactured by forming a predetermined groove in a central region of the substrate 10 and then allowing a sidewall of the groove to be inclined at a predetermined slope. Such a reflective portion is formed such that the reflection of light emitted from the LED chips 20 and 25 can be maximized and emission efficiency can also be enhanced.

The electrodes of this embodiment include first, second and third electrodes 30, 40 and 50 which may be formed on the substrate 10 using a printing technique or an adhesive.

The blue and red LED chips 20 and 25, each of which has positive and negative electrodes on top and bottom planes thereof, are commonly mounted on the second electrode 40 and are connected electrically to the first and third electrodes 30 and 50 through wires 90, respectively, so that the respective LED chips 20 and 25 can be driven simultaneously or independently.

The shape and number of the electrodes 30, 40 and 50 or the resultant mounting configuration of the LED chips 20 and 25 is not limited to the aforementioned description but can be implemented in various ways. For example, the blue and red LED chips, each of which has both of the positive and negative electrodes on a top plane thereof, may be mounted.

Further, the molding member 60 for encapsulating the LED chips 20 and 25 is formed on top of the substrate 10.

The phosphor 70 that emits green light using blue light as an excitation source is included in the molding member 60. As described above, a silicate- or thiogallate-based phosphor may be used as the phosphor 70, and a variety of phosphors may be mixed and then used. As shown in this figure, it is preferred that the phosphors 70 be uniformly distributed in the interior of the molding member 60. Alternatively, after a mixture of the phosphor 70 and resin has been dotted at a predetermined thickness to surround top and side surfaces of the blue LED chip 20, the molding member 60 may be formed.

In this embodiment, light emitted from the blue and red LED chips 20 and 25 are uniformly mixed due to the phosphors 70 evenly distributed in the molding member 60, so that more uniform white light can be implemented.

The molding member 60 may be formed through an injecting process using a mixture of a predetermined epoxy resin and the phosphors 70. Further, the molding member 60 may be formed in such a manner that it is first manufactured using an additional mold and then pressed or heat-treated. The molding member 60 may be shaped into an optical lens form, a flat plate form, a form with a predetermined irregularity on a surface thereof, and the like.

In such a light emitting device of the present invention, primary light is emitted from the blue and red LED chips 20 and 25, and a portion of the primary light excites the phosphor 70 to emit wavelength-converted secondary light, so that a color within a desired spectrum range can be implemented by means of the mixture of the primary and secondary light. That is, blue and red light is emitted from the blue and red LED chips 20 and 25, respectively, and green light is emitted from the phosphor 70 that is excited by a portion of the blue light. Therefore, a portion of blue light and red light serving as the primary light, and green light serving as the secondary light are mixed with one another such that white light can be implemented.

Figure 11:
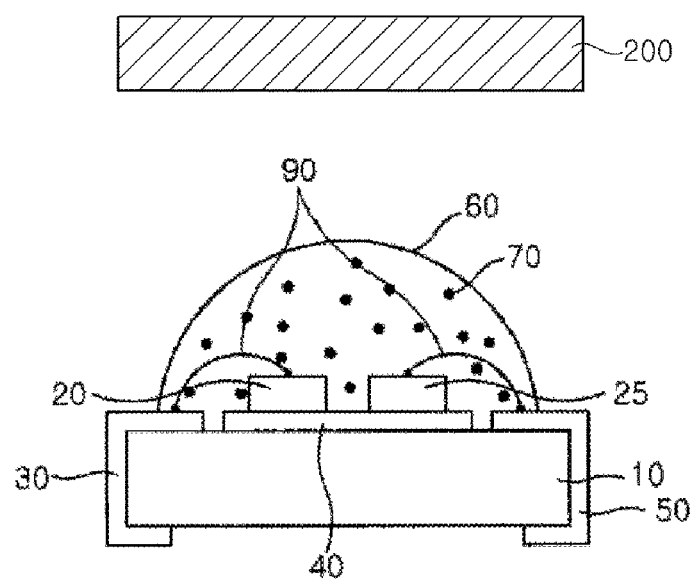
FIG. 11 is a sectional view showing another embodiment of a light emitting device according to the present invention, which includes an RGB color filter.

FIG. 11 is a sectional view showing another embodiment of a light emitting device according to the present invention, which includes an RGB color filter 200. The light emitting device is similar to that described above with respect to FIG. 1, except for the RGB color filter 200.

FIG. 2 is a sectional view showing a second embodiment of the light emitting device according to the present invention.

Referring to this figure, the light emitting device comprises a substrate 10; electrodes 30 and 40 formed on the substrate 10; and LED chips 20 and 25 that emit blue and red light, respectively. A molding member 60 for encapsulating the LED chips 20 and 25 is further formed on top of the substrate 10, and the aforementioned phosphor 70 and a scattering agent 80 are contained in the interior of the molding member 60. The configuration of the light emitting device according to the second embodiment is almost identical with that of the first embodiment, and thus, detailed descriptions overlapping with the first embodiment will be omitted herein.

The electrodes of the second embodiment are formed to include a first electrode 30, a second electrode 40 and a third electrode (not shown). The LED chips 20 and 25 are mounted on the first and second electrode 30 and 40, respectively, and then are commonly connected electrically to the third electrode (not shown) through wires 90. Further, first, second third and fourth electrodes may be provided such that the LED chips 20 and 25 are mounted on the first and second electrodes 30 and 40, respectively, and are independently connected electrically to the third and fourth electrode (not shown) through wires 90.

In addition, the molding member 60 for encapsulating the LED chips 20 and 25 is further formed on top of the substrate 10. The phosphor 70 and the scattering agent 80 are evenly distributed are contained in the molding member 60. As described above, the phosphor used herein may include the phosphor 70, i.e. a silicate or thiogallate-based phosphor, which emits green light using blue light as an excitation source. Moreover, two or more kinds of different phosphors may be mixed and then employed. For example, a YAG-based phosphor may be further contained. In addition, the scattering agent 80 is added such to facilitate mixing the light, and has a particle size of 0.1 to 20 µm. At least one of $SiO_2$, $Al_2O_3$, $TiO_2$, $Y_2O_3$, $CaCO_3$ and MgO is used as the scattering agent 80.

As such, since the light emitting device containing the scattering agent 80 allows light emitted from the LED chips 20 and 25 to be scattered by the scattering agent 80 and then emitted to the outside, light can be uniformly emitted in a wide range without forming an unnecessary light emitting pattern. Accordingly, lights with different wavelengths are emitted in a wide range and then mixed more uniformly, and consequently, the light emitting device can implement uniform white light.

FIG. 3 is a sectional view showing a third embodiment of the light emitting device according to the present invention.

Referring to this figure, the light emitting device comprises a substrate 10; electrodes 30 and 40 formed on the substrate 10; and LED chips 20 and 25 that emit blue and red light, respectively. The configuration of the third embodiment is almost identical with that of the second embodiment, and detailed descriptions overlapping with the second embodiment will be omitted herein. Alternatively, the light emitting device comprises first and second molding members 61 and 62 formed on top of the substrate 10. The phosphors 70 are uniformly distributed in the first molding member 61 to encapsulate the LED chips 20 and 25, and the scattering agents 80 are uniformly distributed in the second molding member 62 to surround the first molding member 61.

Blue and red light is emitted from the blue and red LED chips 20 and 25, respectively, and a portion of the blue light excites the phosphor 70 to emit green light while the blue and red light passes through the first molding member 61. Therefore, a portion of the blue light, the red light and the wavelength-converted green light are mixed with one another to implement white light. At this time, light with different wavelengths is more uniformly mixed by the scattering agent 80 distributed in the second molding member 62, and thus, the light emitting device can implement uniform white light.

Although it is illustrated in this figure that the first molding member 61 with the phosphors 70 contained therein is formed to encapsulate the blue and red LED chips 20 and 25, the present invention is not limited thereto. That is, after the first molding member 61 is formed to encapsulate the blue LED chip 20, the second molding member 62 with the scattering agents 80 uniformly distributed therein may be formed to surround the first molding member 61 and the red LED chip 25.

FIG. 4 is a sectional view showing a fourth embodiment of the light emitting device according to the present invention.

Referring to this figure, the light emitting device comprises a substrate 10; electrodes 30, 40 and 50 formed on the substrate 10; and LED chips 20 and 25 that emit blue and red light, respectively. The configuration of the fourth embodiment is almost identical with that of the first embodiment, and thus, detailed descriptions overlapping with the first embodiment will be replaced with the descriptions corresponding to FIG. 1. Alternatively, this embodiment further comprises a reflector 110 formed on top of the substrate 10 to surround the LED chips 20 and 25, and a molding member 60 for encapsulating the LED chips 20 and 25 mounted in a central hole of the reflector 110 is further included. The phosphors 70 are evenly distributed and contained in the interior of the molding member 60.

To enhance luminance and light-gathering capacity, an inner wall of the reflector that surrounds the LED chips 20 and 25 may be inclined at a predetermined slope. This is preferably to maximize the reflection of light emitted from the LED chips 20 and 25 and to enhance the emission efficiency.

FIG. 5 is a sectional view showing a fifth embodiment of the light emitting device according to the present invention.

Referring to this figure, the light emitting device comprises a housing 100 with first and third electrodes 30 and 50 formed respectively at both sides thereof and a through-hole formed at the center thereof; a substrate 15 mounted into the through-hole of the housing 100; and blue and red LED chips 20 and 25 that are commonly mounted on a second electrode 40 formed on the substrate 15. At this time, the substrate 15 is manufactured as a heat sink using a material with superior thermal conductivity such that heat released from the LED chips 20 and 25 can be more effectively discharged to the outside. A molding member 60 for encapsulating the LED chips 20 and 25 is further included, and the aforementioned phosphors 70 are uniformly mixed and distributed in the molding member 60. Detailed descriptions overlapping with the first to fourth embodiments will be omitted herein.

As described above, the present invention can be applied to products with various structures, and is not limited to the aforementioned embodiments. That is, various modifications and changes can be made thereto. In a case of a lamp-type light emitting device, for example, a white light emitting device of the present invention may be manufactured by mounting blue and red LED chips on a lead terminal and then forming a molding member with a phosphor uniformly distributed therein as described above. Further, although one blue LED chip and one red LED chip are used in the aforementioned embodiments, a plurality of blue and red chips may be configured in accordance with the purpose.

FIGS. 6 and 7 are graphs illustrating the excitation and emission spectra of silicate and thiogallate phosphors applied to the present invention, respectively. As shown in the figures, each of the silicate and thiogallate phosphors absorbs a portion of energy of blue light and exhibits a superior emission spectrum of 510 to 560 nm.

Figure 9:
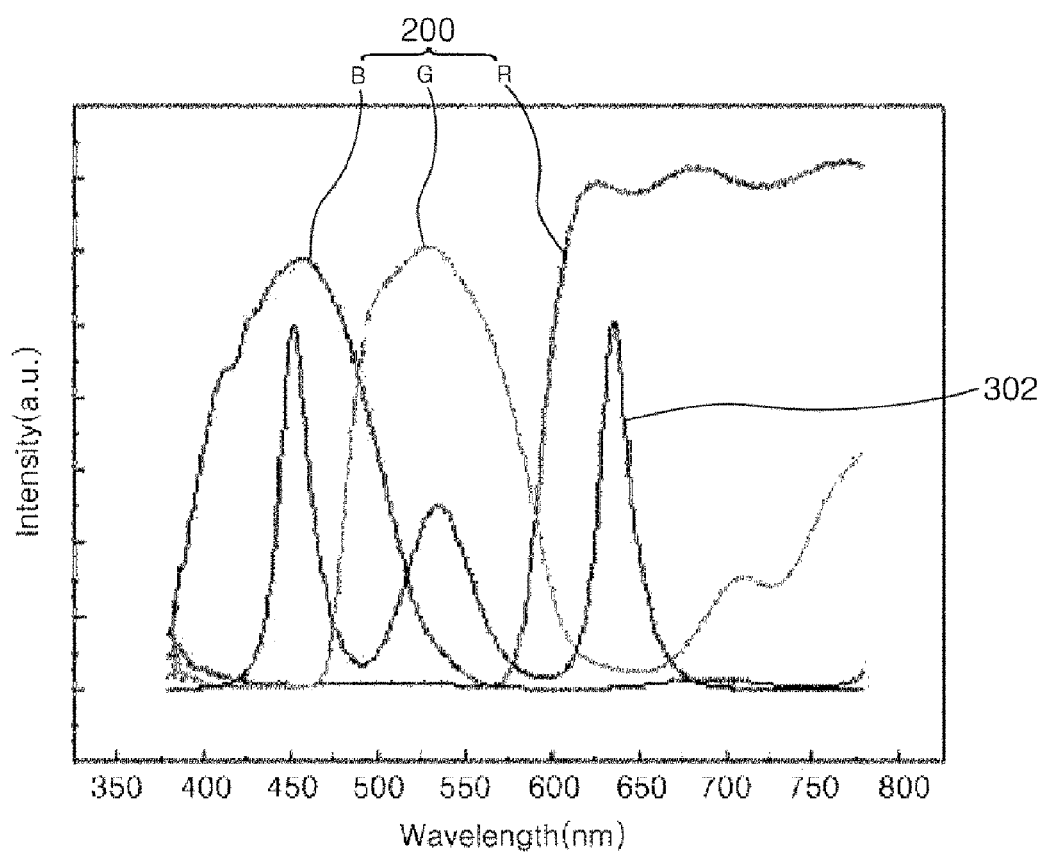
FIG. 9 is a graph illustrating emission spectra of a light emitting device comprising blue and red light emitting diode chips and a thiogallate phosphor together with the transmittance of a general RGB color filter.

FIG. 8 is a graph illustrating emission spectra 301 of a light emitting device comprising blue and red light emitting diode chips and a silicate phosphor together with the transmittance of a general RGB color filter 200. Further, FIG. 9 is a graph illustrating emission spectra 302 of a light emitting device comprising blue and red light emitting diode chips and a thiogallate phosphor together with the transmittance of a general RGB color filter 200. As shown in the figures, since the light emitting device of the present invention has a wider color reproduction range that can be expressed when light transmits the RGB color filter 200, there is an advantage in that images close to natural colors can be implemented.

Figure 10:
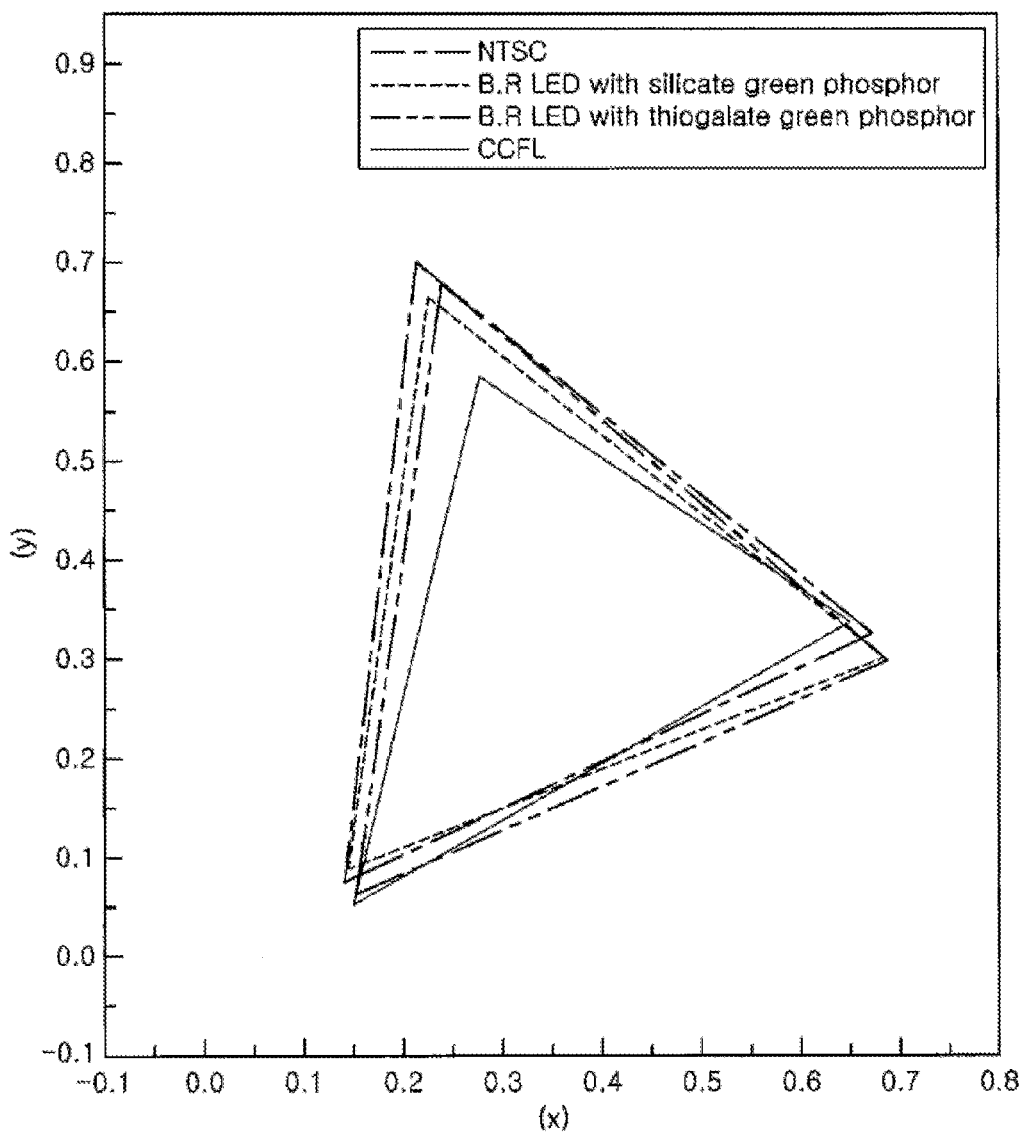
FIG. 10 is a graph illustrating a color reproduction range of a light emitting device according to the present invention after a white light source has been transmitted into a filter.

FIG. 10 is a graph illustrating a color reproduction range of white light from a light emitting device after it has been transmitted into a filter according to the present invention. Color implementation can be made within an area of 72% as compared with the NTSC when a conventional CCFL is used, while an improved color reproduction range of 94 to 100% over the NTSC can be obtained when the light emitting device of the present invention is used.

As described above, a light emitting device of the present invention can be applied to an LCD backlight because of its high luminance and broad color reproduction range characteristics. That is, a general LCD requires a white backlight source. Since a white light emitting device of the present invention exhibits superior luminance and color reproduction characteristics, it can play a very important role in the development of LCDs.

While the present invention has been described in connection with the preferred embodiments, it will be understood by those skilled in the art that various modifications and changes can be made thereto without departing from the spirit and scope of the invention defined by the appended claims.

For example, it has been described in the aforementioned embodiments that a silicate or thiogallate phosphor is used as a phosphor that is excited by blue light to emit green light. However, two or more kinds of phosphors selected among phosphors that are excited by blue light to emit green light may be combined and employed in various ways. Moreover, YAG-based phosphors may be further included.

What is claimed is:

1. A light emitting apparatus, comprising:
a first light source to emit blue light comprising a first spectrum with a first peak wavelength;
a second light source to be excited by the blue light and emit green light comprising a second spectrum with a second peak wavelength;
a third light source to emit red light comprising a third spectrum with a third peak wavelength; and
an RGB color filter, the RGB color filter producing wavelength response areas respectively corresponding to the first spectrum of the first light source, the second spectrum of the second light source, and the third spectrum of the third light source,
wherein the wavelength response area of the RGB color filter corresponding to the second spectrum of the second light source substantially covers the second spectrum with the second peak wavelength,
wherein the second light source comprises at least one first phosphor, the at least one first phosphor comprising a phosphor expressed by at least one of the following chemical formulae:

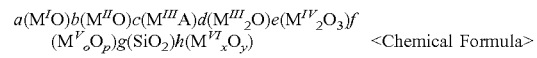

$a(M^{I}O)b(M^{II}O)c(M^{III}A)d(M^{III}{}_{2}O)e(M^{IV}{}_{2}O_{3})f$
$(M^{V}{}_{o}O_{p})g(SiO_{2})h(M^{VI}{}_{x}O_{y})$  <Chemical Formula> wherein $M^{I}$ is at least one element selected from the group consisting of Pb and Cu, $M^{II}$ is at least one element selected from the group consisting of Be, Mg, Ca, Sr, Ba, Zn, Cd and Mn, $M^{III}$ is at least one element selected from the group consisting of Li, Na, K, Rb, Cs, Au and Ag, $M^{IV}$ is at least one element selected from the group consisting of B, Al, Ga and In, $M^{V}$ is at least one element selected from the group consisting of Ge, V, Nb, Ta, W, Mo, Ti, Zr and Hf, $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu, A is at least one element selected from the group consisting of F, Cl, Br and I, and wherein a, b, c, d, e, f, g, h, o, p, x and y are set in a range of $0 \leq a \leq 2$, $0 < b \leq 8$, $0 \leq c \leq 4$, $0 \leq d \leq 12$, $0 \leq e \leq 2$, $0 \leq f \leq 2$, $0 \leq g \leq 2$, $0 \leq g \leq 10$, $0 \leq h \leq 5$, $1 \leq o \leq 2$, $1 \leq p \leq 5$, $1 \leq x \leq 2$ and $1 \leq y \leq 5$; and $$(A_{1-x-y}Eu_x)(M^I_{0.5}M^{II}_{0.5})_y)B_2S_4 \quad \text{<Chemical Formula>}$$

wherein A is at least one element selected from the group consisting of Ba, Sr and Ca, B is at least one element selected from the group consisting of Al, Ga and In, $M^I$ is at least one rare earth element selected from the group consisting of Sc, Y, La, Gd and Lu, $M^{II}$ is at least one element selected from the group consisting of Li, Na and K, and wherein x and y are set in a range of $0.005 < x < 0.9$, $0 < y < 0.995$ and $x+y<1$.

2. The light emitting apparatus of claim 1, wherein the first peak wavelength of the first light source is in a range from about 430 to about 500 nm, the second peak wavelength of the second light source is in a range from about 500 to about 580 nm, and the third peak wavelength of the third light source is in a range from about 580 to about 760 nm.

3. The light emitting apparatus of claim 1, further comprising a scattering agent comprising a particle size of about 0.1 to about 20 μm.

4. The light emitting apparatus of claim 3, wherein the scattering agent is at least one selected from the group consisting of $SiO_2$, $Al_2O_3$, $TiO_2$, $Y_2O_3$, $CaCO_3$ and MgO.

5. The light emitting apparatus of claim 1, wherein the second light source comprises a silicate phosphor.

6. The light emitting apparatus of claim 5, wherein the silicate phosphor comprises copper.

7. The light emitting apparatus of claim 1, wherein the second light source comprises a yttrium aluminum garnet (YAG) phosphor.

8. The light emitting apparatus of claim 1, wherein the wavelength response area of the first light source color filter substantially covers the first spectrum, the wavelength response area of the third light source color filter substantially covers the third spectrum, or the wavelength response area of the first light source color filter substantially covers the first spectrum and the wavelength response area of the third light source color filter substantially covers the third spectrum.

9. The light emitting apparatus of claim 1, wherein the second light source peak wavelength is substantially the same as a peak wavelength of the wavelength response area of the color filter corresponding to the spectrum of the second light source.

10. The light emitting apparatus of claim 1, wherein the second peak wavelength is substantially the same as a peak wavelength of the wavelength response area of the color filter corresponding to the spectra of the second light source, and wherein and the third peak wavelength is substantially the same as a peak wavelength of the wavelength response area of the color filter corresponding to the spectra of the third light source.

11. The light emitting apparatus of claim 1, wherein the first peak wavelength is located substantially at the center of the wavelength response area of the color filter corresponding to the spectrum of the first light source.

12. The light emitting apparatus of claim 1, wherein the third light source comprises at least one second phosphor, the at least one second phosphor comprising a phosphor expressed by at least one of the following chemical formulae:

$$a(M^IO)b(M^{II}O)c(M^{III}A)d(M^{III}_2O)e(M^{IV}_2O_3)f(M^V_oO_p)g(SiO_2)h(M^{VI}_xO_y) \quad \text{<Chemical Formula>}$$

wherein $M^I$ is at least one element selected from the group consisting of Pb and Cu, $M^{II}$ is at least one element selected from the group consisting of Be, Mg, Ca, Sr, Ba, Zn, Cd and Mn, $M^{III}$ is at least one element selected from the group consisting of Li, Na, K, Rb, Cs, Au and Ag, $M^{IV}$ is at least one element selected from the group consisting of B, Al, Ga and In, $M^V$ is at least one element selected from the group consisting of Ge, V, Nb, Ta, W, Mo, Ti, Zr and Hf, $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu, A is at least one element selected from the group consisting of F, Cl, Br and I, and wherein a, b, c, d, e, f, g, h, o, p, x and y are set in a range of $0 \leq a \leq 2$, $0 < b \leq 8$, $0 \leq c \leq 4$, $0 \leq d \leq 12$, $0 \leq e \leq 2$, $0 \leq f \leq 2$, $0 \leq g \leq 10$, $0 \leq h \leq 5$, $1 \leq o \leq 2$, $1 \leq p \leq 5$, $1 \leq x \leq 2$ and $1 \leq y \leq 5$;

$$(A_{1-x-y}Eu_xM^I_y)(B_{2-y}M^{II}_y)S_4 \quad \text{<Chemical Formula>}$$

wherein A is at least one element selected from the group consisting of Ba, Sr and Ca, B is at least one element selected from the group consisting of Al, Ga and In, $M^I$ is at least one rare earth element selected from the group consisting of Sc, Y, La, Gd and Lu, $M^{II}$ is at least one element selected from the group consisting of Mg, Zn and Be, and wherein x and y are set in a range of $0.005 < x < 0.9$, $0 < y < 0.995$ and $x+y<1$; and $$(A_{1-x-y}Eu_x)(M^I_{0.5}M^{II}_{0.5})_y)B_2S_4 \quad \text{<Chemical Formula>}$$

wherein A is at least one element selected from the group consisting of Ba, Sr and Ca, B is at least one element selected from the group consisting of Al, Ga and In, $M^I$ is at least one rare earth element selected from the group consisting of Sc, Y, La, Gd and Lu, $M^{II}$ is at least one element selected from the group consisting of Li, Na and K, and wherein x and y are set in a range of $0.005 < x < 0.9$, $0 < y < 0.995$ and $x+y<1$.

13. A light emitting apparatus, comprising:
a first light source to emit blue light comprising a first spectrum with a first peak wavelength;
a second light source to be excited by the blue light and emit green light comprising a second spectrum with a second peak wavelength;
a third light source to emit red light comprising a third spectrum with a third peak wavelength; and
an RGB color filter, the RGB color filter producing wavelength response areas respectively corresponding to the first spectrum of the first light source, the second spectrum of the second light source, and the third spectrum of the third light source,
wherein the second peak wavelength is substantially the same as a peak of the wavelength response area of the RGB color filter corresponding to the second spectrum of the second light source,
wherein the second light source comprises at least one first phosphor, the at least one first phosphor comprising a phosphor expressed by at least one of the following chemical formulae:

$$a(M^IO)b(M^{II}O)c(M^{III}A)d(M^{III}_2O)e(M^{IV}_2O_3)f(M^V_oO_p)g(SiO_2)h(M^{VI}_xO_y) \quad \text{<Chemical Formula>}$$

wherein $M^I$ is at least one element selected from the group consisting of Pb and Cu, $M^{II}$ is at least one element selected from the group consisting of Be, Mg, Ca, Sr, Ba, Zn, Cd and Mn, $M^{III}$ is at least one element selected from the group consisting of Li, Na, K, Rb, Cs, Au and Ag, $M^{IV}$ is at least one element selected from the group consisting of B, Al, Ga and In, $M^V$ is at least one element selected from the group consisting of Ge, V, Nb, Ta, W, Mo, Ti, Zr and Hf, $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu, A is at least one element selected from the group consisting of F, Cl, Br and I, and wherein a, b, c, d, e, f, g, h, o, p, x and y are set in a range of $0 \le a \le 2$, $0 < b \le 8$, $0 \le c \le 4$, $0 \le d \le 12$, $0 \le e \le 2$, $0 \le f \le 2$, $0 \le g \le 10$, $0 \le h \le 5$, $1 \le o \le 2$, $1 \le p \le 5$, $1 \le x \le 2$ and $1 \le y \le 5$; and $$(A_{1-x-y}Eu_x)(M^I_{0.5}M^{II}_{0.5})_y)B_2S_4 \quad \text{<Chemical Formula>}$$

wherein A is at least one element selected from the group consisting of Ba, Sr and Ca, B is at least one element selected from the group consisting of Al, Ga and In, $M^I$ is at least one rare earth element selected from the group consisting of Sc, Y, La, Gd and Lu, $M^{II}$ is at least one element selected from the group consisting of Li, Na and K, and wherein x and y are set in a range of $0.005 < x < 0.9$, $0 < y < 0.995$ and $x+y<1$.

14. The light emitting apparatus of claim 13, wherein the second light source comprises a silicate phosphor.

15. The light emitting apparatus of claim 14, wherein the silicate phosphor comprises copper.

16. The light emitting apparatus of claim 13, wherein the second light source comprises a yttrium aluminum garnet (YAG) phosphor.

17. The light emitting apparatus of claim 13, wherein the wavelength response area of first light source color filter substantially covers the first spectrum, the wavelength response area of the third light source color filter substantially covers the third spectrum, or the wavelength response area of the first light source color filter substantially covers the first spectrum and the wavelength response area of the third light source color filter substantially covers the third spectrum.

18. The light emitting apparatus of claim 13, wherein the third light source peak wavelength is substantially the same as a peak wavelength of the wavelength response area of the color filter corresponding to the spectrum of the third light source.

19. The light emitting apparatus of claim 13, wherein the first light source peak wavelength is located substantially at the center of the wavelength response area of the color filter corresponding to the spectrum of the first light source.

20. The light emitting apparatus of claim 13, wherein the third light source comprises at least one second phosphor, the at least one second phosphor comprising a phosphor expressed by at least one of the following chemical formulae:

$$a(M^IO)b(M^{II}O)c(M^{III}A)d(M^{III}_2O)e(M^{IV}_2O_3)f(M^V_oO_p)g(SiO_2)h(M^{VI}_xO_y) \quad \text{<Chemical Formula>}$$

wherein $M^I$ is at least one element selected from the group consisting of Pb and Cu, $M^{II}$ is at least one element selected from the group consisting of Be, Mg, Ca, Sr, Ba, Zn, Cd and Mn, $M^{III}$ is at least one element selected from the group consisting of Li, Na, K, Rb, Cs, Au and Ag, $M^{IV}$ is at least one element selected from the group consisting of B, Al, Ga and In, $M^V$ is at least one element selected from the group consisting of Ge, V, Nb, Ta, W, Mo, Ti, Zr and Hf, $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu, A is at least one element selected from the group consisting of F, Cl, Br and I, and wherein a, b, c, d, e, f, g, h, o, p, x and y are set in a range of $0 \le a \le 2$, $0 < b \le 8$, $0 \le c \le 4$, $0 \le d \le 12$, $0 \le e \le 2$, $0 \le f \le 2$, $0 \le g \le 10$, $0 \le h \le 5$, $1 \le o \le 2$, $1 \le p \le 5$, $1 \le x \le 2$ and $1 \le y \le 5$;

$$(A_{1-x-y}Eu_xM^I_y)(B_{2-y}M^{II}_y)S_4 \quad \text{<Chemical Formula>}$$

wherein A is at least one element selected from the group consisting of Ba, Sr and Ca, B is at least one element selected from the group consisting of Al, Ga and In, $M^I$ is at least one rare earth element selected from the group consisting of Sc, Y, La, Gd and Lu, $M^{II}$ is at least one element selected from the group consisting of Mg, Zn and Be, and wherein x and y are set in a range of $0.005 < x < 0.9$, $0 < y < 0.995$ and $x+y<1$; and $$(A_{1-x-y}Eu_x)(M^I_{0.5}M^{II}_{0.5})_y)B_2S_4 \quad \text{<Chemical Formula>}$$

wherein A is at least one element selected from the group consisting of Ba, Sr and Ca, B is at least one element selected from the group consisting of Al, Ga and In, $M^I$ is at least one rare earth element selected from the group consisting of Sc, Y, La, Gd and Lu, $M^{II}$ is at least one element selected from the group consisting of Li, Na and K, and wherein x and y are set in a range of $0.005 < x < 0.9$, $0 < y < 0.995$ and $x+y<1$.

* * * * *